United States Patent [19]

Bieber et al.

[11] 3,973,952

[45] Aug. 10, 1976

[54] HEAT RESISTANT ALLOY CASTING

[75] Inventors: Clarence George Bieber, West Milford; John Raymond Mihalisin, North Caldwell, both of N.J.; John Joseph Galka, Tuxedo Park, N.Y.

[73] Assignee: The International Nickel Company, Inc., New York, N.Y.

[22] Filed: June 11, 1973

[21] Appl. No.: 368,689

[52] U.S. Cl. .................................. 75/171; 29/182; 148/32.5; 148/162
[51] Int. Cl.² .................... C22C 19/05; C22C 1/04; C22F 1/10
[58] Field of Search ............... 75/171; 148/13, 32.5, 148/162; 29/182, 182.5, 182.7, 182.8

[56] References Cited
UNITED STATES PATENTS

| 3,293,030 | 12/1966 | Child et al. | 75/171 |
|---|---|---|---|
| 3,459,545 | 8/1969 | Bieber et al. | 75/171 |
| 3,494,709 | 2/1970 | Piearcey | 75/171 X |
| 3,619,182 | 11/1971 | Bieber et al. | 75/171 |
| 3,620,855 | 11/1971 | Wagner et al. | 75/171 X |
| 3,698,962 | 10/1972 | Kasak et al. | 75/226 X |
| 3,720,509 | 3/1973 | Danesi | 75/171 |

OTHER PUBLICATIONS

Collins, H. E. et al, Development of a Nickel Base Superalloy Using Statically Designed Experiments, In Trans, ASM, 61; pp. 711–721 (1968).

*Primary Examiner*—Richard E. Schafer
*Attorney, Agent, or Firm*—George N. Ziegler; Ewan C. MacQueen; Raymond J. Kenny

[57] ABSTRACT

Heat-resistant alloy containing specially controlled proportions of nickel, chromium, titanium, aluminum, tungsten, molybdenum and tantalum is especially advantageous for production of heat resistant castings having strength and ductility throughout a broad range of temperatures, particularly including stress-rupture strength at 1850°F. and ductility at intermediate temperatures such as 1400°F.

16 Claims, No Drawings

HEAT RESISTANT ALLOY CASTING

The present invention relates to heat-resistant alloys and more particularly to nickel-chromium heat-resistant alloys.

Needs for high-strength heat-resistant alloys in gas turbines and other thermal engines and high temperature service apparatus are well known. Moreover, in the course of development of gas turbines it has been practically axiomatic to demand that alloys withstand higher operating temperatures in order to improve turbine performance. Thus, temperature specifications for stress-rupture testing, which has been a major criterion of alloy capabilities in gas turbines, have moved progressively upwards. Other characteristics that are desired and often required of gas turbine alloys include short-time tensile strengths, ductility and phase stability. More recently, capability to withstand low cycle thermal fatigue has become of increasing importance for some special conditions, such as occur in land-based turbine operation. While turbine operating temperatures have increased, it has been important and has become more and more a difficult problem to provide an alloy that maintains ductile characteristics throughout the full range of turbine operation, especially when the turbine is subject to frequent starting and stopping with consequent heating and cooling, e.g., as in turbines for automobiles and trucks. Intermediate temperature characteristics, particularly ductility at temperatures around 1400°F. have presented a special problem that is sometimes referred to as the low-ductility trough. Presently there is a need for a heat-resistant alloy that possesses both high strength and good ductility throughout the temperature range of from room temperature to a high elevated temperature of 1850°F. or higher.

An object of the present invention is to provide a heat-resistant alloy.

Other objects and advantages will become apparent from the following description.

The present invention particularly contemplates a heat-resistant alloy that is typically characterized in the heat-treated condition by a stress-rupture life of about 35 hours at 1850°F. and 29,000 pounds per square inch and by a nominal composition of about 8% chromium, about 10% cobalt, about 8% to 10% tungsten, e.g., about 9% tungsten, about 2% molybdenum, about 4% tantalum, about 3% aluminum, about 4–3/4% titanium, about 0.1% carbon, about 0.1% zirconium, about 0.06% boron and balance essentially nickel. The annealed and aged condition referred to in connection with stress-rupture life of the present alloy is the condition obtained by heat treatments such as the double heat treatment comprising heating for 2 hours at 2050°F., air cooling, reheating for 16 to 24 hours at 1550°F., followed by air cooling, and also obtainable by a triple heat treatment comprising heating two hours at 2150°F., air cooling, reheating for four hours at 1950°F., air cooling, then reheating for 24 hours at 1550°F., followed by air cooling. Elongations accompanying the typical 35 hour stress-rupture lives are typically about 7%.

It is well known that stress-rupture test results can show noticeable differences in life to rupture, commonly called scatter, when tests are made on a number of tensile bars of essentially the same composition, although carefully produced by good, essentially similar, melting and casting practices. Herein, typical life refers to the average (or mean) life obtained from a number of tests. When eleven stress-rupture tests were made at 1850°F., and 29,000 psi on specimens from three melts of the alloy of the nominal composition (melts 1 and 2 with 10% tungsten and melt 3 with 8% tungsten) in the heat-treated condition, the typical life was 36.5 hours and the scatter ranged from 30.9 to 46.2 hours; elongation averaged 8% and ranged from 5% to 11% (results referred to hereinafter in Table II). Although, the 36½ hour life of the present alloy is referred to as typical for statistical purposes, this stress-rupture life of over 36 hours at 1850°F. and 29,000 psi is excellent stress-rupture life for practical purposes of producing heat-resistant articles for service in high temperature engines, such as jet engines, power generators and gas turbines, e.g., turbine blades in automotive and truck gas turbines. The nominal composition is most advantageous for obtaining excellent stress-rupture strength at high temperatures of 1850°F. or higher, e.g., 1900°F.

A recommended working range for producing castings of the nominal, most advantageous, composition is 7% to 8% chromium, 8% to 12% cobalt, 7.5% to 10.5% tungsten, 1.5% to 2.5% molybdenum, 3% to 4.5% tantalum, 2.5% to 3.5% aluminum, 4% to 5% titanium, 0.06% to 0.15% carbon, .05% to 0.15% zirconium, .01% to 0.08% boron and balance essentially nickel. Of course, when carrying this range into practice it is aimed at the nominal composition so as to avoid having some of the elements simultaneously at the high or the low sides of the range. About 10% tungsten, with a range of 9% to 10.5% tungsten, is especially recommended for consistently obtaining long life in stress-rupture. A lower tungsten content of about 8%, with a range of 7.5% to 8.5% tungsten, is recommended for uses where lower density is important along with long life.

Of further advantage in addition to stress-rupture strength at high temperatures, the alloy is stable against sigma formation, shows excellent low cycle (and) low-frequency fatigue behavior and possesses and retains desirable characteristics of ductility and short-time tensile strength throughout a wide range of temperature extending at least as far as from room temperature up to 1850°F. A particularly significant advantage is that the alloy possessses ductility in the 1400°F. low ductility trough that sometimes detrimentally characterizes other alloys.

The alloy is particularly satisfactory for production in the form of cast-to-shape articles, e.g., gas turbine blades. Double vacuum melting and ceramic shell mold casting techniques are preferred for making high quality castings of the alloy. Heat treatment by heating at 2000°F. to 2200°F., or even as low as 1975°F., for about 1 hour or longer, e.g., 2 or 4 hours, and then at 1500°F. to 1600°F. for about 12 hours or more, e.g., 16 hours or 24 hours is frequently beneficial to stress-rupture life at high elevated temperatures. If desired, an intermediate heat treatment by heating at 1900°F. to 1975°F. for 2 hours to 6 hours between the higher and the lower of the aforesaid two heatings may also be applied to the castings. Generally, when heat treating castings of the invention, the castings are air cooled after each of the heatings.

In production of examples of the invention, master melts were prepared by vacuum induction melting high purity virgin raw materials, e.g., carbonyl nickel (except that boron was introduced as nickel-boron) and cast in vacuum to provide ingots. The master melt ingots or portions thereof were vacuum remelted and vacuum cast into preheated (1800°F.) cobalt oxide-inoculated ceramic shell molds to produce castings, including cast-to-size ¼-inch diameter tensile test bars. Melts 1, 2 and 3 were proportioned according to the composition most advantageous for achieving excellent stress-rupture strength at 1850°F. comprising, when stated in nominal terms, 8% chromium, 10% cobalt, 2% molybdenum, 8% to 10% tungsten, 4% tantalum, 3% aluminum, 4.75% titanium, 0.06% boron, 0.1% zirconium, 0.1% carbon and balance nickel, with use of 10% tungsten in melts 1 and 2 and 8% tungsten in melt 3. These three melts were made a number of days apart and eleven heat-treated tensile bars were stress-rupture tested at 1850°F. and 29,000 psi to confirm the reproducibility and consistency of the stress-rupture life provided by this composition. Nine of the bars were given the double heat treatment of 2 hours at 2050°F., air cool, 24 hours at 1550°F., then air cool, and the other two had the triple heat treatment of 2 hours at 2150°F., air cool, 4 hours at 1950°F., air cool, 24 hours at 1550°F., then air cool. Stress-rupture test results of test bar life in hours (Hr.), tensile elongation in 1.25-inch gage length (El.) and percent reduction of area (RA) are set forth in the following Table I.

TABLE I (1850°F./29,000 psi)

| Melt No. 1 | | | Melt No. 2 | | | Melt No. 3 | | |
|---|---|---|---|---|---|---|---|---|
| Life (hr.) | El. (%) | R.A. (%) | Life (hr.) | El. (%) | R.A. (%) | Life (hr.) | El. (%) | R.A. (%) |
| 32.4 | 6 | 10 | 40.0 | 7 | 6 | 38.2 | 5 | 9 |
| 41.3 | 5 | 11 | 39.6 | 9 | 9 | 33.9 | 10 | 9 |
| 31.5 | 8 | 9 | | | | 33.2 | 9 | 10 |
| 46.2 | 9 | 7 | | | | *30.9 | 11 | 15 |
| | | | | | | *33.8 | 7 | 11 |

*Tested in triple heat-treated condition

A stress-rupture test at 1850°F. and 29,000 psi on a tensile bar from melt 3 in the as-cast condition resulted in a life of 25.6 hours, an elongation of 5% and a reduction in area of 6%.

Results of other tests including short-time tensile strength results of ultimate tensile strength in kips (1000 pounds) per square inch (UTS, ksi) and 0.2% offset yield strength (YS) and stress-rupture test results at temperatures below and above 1850°F. performed on double heat treated specimens of melts 1 and 2 are set forth in Tables II and III infra.

TABLE II

| No. | Temp., °F. | UTS, ksi | YS, ksi | Elong., % | R.A., % |
|---|---|---|---|---|---|
| 2 | Room | 177.3 | 155.1 | 3 | 3 |
| 1 | Room | 178.2 | 156.0 | 4 | 6 |
| 1 | 1000 | 184.2 | 153.7 | 5 | 9 |
| 1 | 1400 | 171.0 | 145.0 | 2 | 6 |

TABLE III

| No. | Temp., °F. | Stress, ksi | Life, Hours | Elong., % | R.A., % |
|---|---|---|---|---|---|
| 2 | 1400 | 105 | 272 | 4 | 2 |
| 1 | 1400 | 110 | 139 | 6 | 6 |
| 2 | 1500 | 62*/65* | 1745* | 5 | 9 |
| 2 | 1700 | 47 | 108 | 5 | 10 |
| 1 | 1700 | 47 | 68 | 6 | 7 |

TABLE III-continued

| No. | Temp., °F. | Stress, ksi | Life, Hours | Elong., % | R.A., % |
|---|---|---|---|---|---|
| 2 | 1900 | 19 | 102 | 5 | 8 |

*239 hours at 62,000 psi plus continued additional 1506 hours at 65,000 psi

A cross-section of the specimen of melt 2 that had been heated at 1500°F. for 1745 hours during the stress-rupture test thereof was examined micrographically and was found to consist essentially of gamma and gamma prima phases and to be devoid of sigma phase.

Good, although not always excellent, stress-rupture life of at least 20 hours at 1850°F. and 29,000 psi stress, along with other desired characteristics, can be obtained with alloy compositions controlled according to certain specially restricted good composition ranges of the invention. For this purpose, particularly good ranges for chromium, tungsten and molybdenum are about 6% to 8% chromium, 7.5% to 12% tungsten, advantageously 8% to 10% tungsten, and 1% or 2% to 3% or 4% molybdenum. Tungsten and molybdenum are not interchangeable equivalents for the present invention and are required in the ranges of 7.5% to 12% tungsten and 1% to 4% molybdenum in order to obtain the combination of desirable characteristics provided by the invention. Moreover, for obtaining good characteristics the total of tungsten and molybdenum is controlled to avoid exceeding a total of 14% and the chromium content is controlled in conjunction with the tungsten and molybdenum contents to avoid exceeding a total of about 20% chromium-plus-tungsten-plus-molybdenum. Advantageously, the total of tungsten-plus-molybdenum is 10% to 12% and the total of chromium-plus-tungsten-plus-molybdenum is 16% to 20%.

For use where corrosion resistance is particularly important and the best mechanical properties are not required, the chromium content may be increased modestly to about 9%. On the other hand, if corrosion resistance is of lesser importance, the chromium content may be as low as 5%. In any event, the alloy contains at least 5% and not more than 9% chromium.

Good stress-rupture strength and ductility characteristics are obtainable with aluminum and titanium present in amounts totaling at least 6.5%, advantageously 7.5% to 8%, and not greater than 8.5% and with these elements in ranges of 2.5% to 5% aluminum and 2.5%, to about 4.8% or up to a maximum of 5% titanium; unsatisfactory results were obtained with 5.25% titanium. For obtaining high stress-rupture strength it is recommended that the titanium content substantially exceed the aluminum content, e.g., by a ratio of 1.2 or 1.8 titanium to aluminum, advantageously a titanium:aluminum ratio of 1.6:1.

Or, for some special needs, for instance, for special oxidation resistance or for castability without a high vacuum environment, it may be desirable to have the aluminum substantially exceed the titanium, e.g., by a ratio of 1.5 or 2 to 1.

Cobalt in a proportion of about 7% to 15% or 16%, advantageously 8% to 12%, of the alloy provides an essential contribution to the strength and ductility of the alloy.

At least 3% tantalum is required in the alloy in order to obtain good stress-rupture strength. In most instances, such as when the chromium-plus-tungsten-plus-molybdenum content totals 17% or more, the tantalum content is restricted to not more than 5%, and in any event the tantalum content does not exceed 6% in order to achieve the desired characteristics of good stress-rupture life at 1850°F. and satisfactory ductility at lower temperatures.

Presence of carbon, zirconium and boron in amounts of at least 0.01% and not greater than about 0.2% carbon, 0.2% zirconium and 0.1% boron is essential in the alloy. At least 0.04% carbon and at least 0.01% boron are desirable for obtaining good strength and ductility. Restriction of carbon to about 0.15% is advantageous for assuring adequate ductility. For production, ranges of 0.05% to 0.1% or 0.05% to 0.2% zirconium and 0.02% to 0.08% boron are recommended.

The nickel content, which is at least 50%, e.g., 52%, and is advantageously 55% or more, e.g., 57%, contributes to the good characteristics of the alloy, e.g., strength and ductility. Thus, amounts of any useless elements or impurities in the alloy should be held as low as practical in order to avoid displacing nickel in the balance. For instance, the amount of any iron in the alloy should not exceed about 2% and is advantageously lower, e.g., 1% or less, more advantageously not more than 0.5%.

Additional elements that may be present, if desired, include up to 2% or possibly as much as 3% hafnium, up to 0.02% yttrium, up to 1% vanadium, and up to 2% columbium. However, it is to be understood that columbium is not a fully satisfactory substitute for tantalum in the alloy of the present invention. Hafnium additions, e.g., 1.5% hafnium, may be desirable in many uses for benefiting castability in large or complex sections. Other possibly beneficial additions include 0.01% or 0.02% yttrium for enhancing ductility at elevated temperatures. Elements such as sulfur, selenium, tellurium, phosphorous, arsenic, bismuth, lead and tin are detrimental impurities and should be held as low as practical. Iron is deemed a detrimental although practically unavoidable impurity inasmuch as excessive amounts could contribute to formation of sigma phase.

In the light of the foregoing, the invention provides heat-resistant alloys containing 5% to 9% chromium, 7.5% to 12% tungsten and 1% to 4% molybdenum with the total of tungsten-plus-molybdenum not greater than 14% and the total of chromium-plus-tungsten-plus-molybdenum not greater than 20%, about 7% to about 16% cobalt, 3% to 6% tantalum, 2.5% to 5% aluminum and 2% to 5% titanium with the total of aluminum-plus-titanium being 6.5% to 8.5%, 0.01% to 0.2% carbon, 0.01% to about 0.2% zirconium, 0.01% to about 0.1% boron, up to about 3% hafnium, up to about 2% columbium, up to about 2% iron, up to about 1% vanadium, up to about 0.02% yttrium and balance essentially nickel in an amount comprising at least 50% of the alloy.

Stress-rupture lives of at least 20 hours at 1850°F. and 29,000 psi were obtained with test bars made of double vacuum melted alloys from melts 4 to 12, referred to in Table IV, which were vacuum cast to size in preheated (1800°F.) ceramic shell molds. Heat treatment was the double heat treatment at 2050°F. and 1550°F. Alloy compositions of melts 4 to 12 varied from the composition containing 8% chromium, 10% cobalt, 10% tungsten, 2% molybdenum, 4% tantalum, 3% aluminum, 4¾% titanium, 0.1% (or 0.09%) carbon, 0.06% boron, 0.1% zirconium and balance nickel with variations consisting of the percentages of elements set forth in Table IV, e.g., the nominal composition of melt 8 was 8% chromium, 8% tungsten, 15% cobalt, 5% titanium, 4% molybdenum, 4% tantalum, 3% aluminum, 0.1% carbon, 0.06% boron, 0.1% zirconium and balance nickel.

TABLE IV

| Melt No. | Variation (Weight %) | Life | El. | R.A. | Life | El. | R.A. |
|---|---|---|---|---|---|---|---|
| 4 | 6 Cr | 25.1 | 10 | 9 | 28.0 | 7 | 9 |
|  |  | 25.5 | 8 | 8 |  |  |  |
| 5 | 3.5Al/4.25Ti | 23.1 | 4 | 5 | 33.4 | 5 | 6 |
|  |  | 35.2 | 5 | 11 | 28.7 | 6 | 5 |
| 6 | 0.04C | 26.2 | 8 | 10 | 29.1 | 6 | 11 |
|  |  | 29.6 | 7 | 10 | 25.0 | 7 | 12 |
| 7 | 5Al/2.6Ti | 22.1 | 3 | 4 | 26.7 | 4 | 3 |
|  |  | 25.3 | 4 | 5 |  |  |  |
| 8 | 8W/15Co/5Ti/4Mo | 26.4 | 8 | 7 | 24.6 | 7 | 8 |
|  |  | 21.4 | 4 | 8 | 22.9 | 7 | 8 |
| 9 | 8W/15Co/5Ti | 27.6 | 10 | 12 | 21.9 | 5 | 10 |
|  |  | 31.2 | 11 | 11 | 28.9 | 9 | 12 |
| 10 | 12W/6Cr | 35.2 | 4 | 6 | 24.0 | 5 | 6 |
|  |  | 27.6 | 4 | 5 | 30.0 | 5 | 6 |
| 11 | 8W/4Mo | 24.5 | 5 | 6 | 33.0 | 7 | 9 |
|  |  | 25.9 | 6 | 11 | 23.2 | 6 | 7 |
| 12 | 8W/1.3HF | 27.6 | 5 | 6 | 30.6 | 5 | 3 |
|  |  | 20.1 | 7 | 7 |  |  |  |

Tensile tests at room temperature and stress-rupture tests at 1400°F. with 110,000 psi loads were performed on double heat-treated tensile specimens cast from each of melts 4 to 12 (except that melt 12 was not tensile tested at room temperature) and all demonstrated at least 2%, actually 3% or more, elongation at room temperature and at 1400°F. Room temperature yield strengths were about 150,000 psi, e.g., 145,000 psi and 157,000 psi, except for a 135,000 psi yield obtained with melt 11, and the stress-rupture lives were all at least 50 hours with individual tests ranging up to 212 hours. Among melts 4 to 12, the longest 1400°F. stress-rupture life and the highest room temperature yield strength were obtained with melt 9.

The present invention is applicable for production of gas turbine components, particularly including articles such as blades and vanes in land-based gas turbines, e.g., turbine engines for trucks and automobiles or for turbine driven electric power generators, and also in aircraft power turbines. While the alloy composition of the invention is especially applicable for production of cast products, including sand castings, investment mold castings and ceramic shell castings, the invention is also applicable for production of wrought products, including extrusions, forgings and rolling mill products, and for production of powder metallurgy products, including mechanically alloyed powder metal products having small amounts of nonmetallic phases, e.g., oxides or nitrides of yttrium, lanthanum or thorium, dispersed therein. Further, for applications where the high costs of such practices are acceptable, it is recommended that the alloy be cast and solidified using directional solidification processes, which may comprise plane-front solidification and single-crystal production techniques, to produce directionally solidified castings, e.g., columnar grain-structured castings and longitudinally solidified turbine blades of the alloy of the invention, in order to avoid transverse grain boundaries and obtain further improvement in stress-rupture strength. The invention is also useful for high strength components in composite articles and structures having corrosion-resistant coatings, e.g., turbine blades comprising the alloy of the invention with a protective coating for resisting severely corrosive conditions, e.g., severely sulfidizing environments. Furthermore, it is contemplated that in addition to being useful for components of turbines and internal combustion engines generally, the composition of the invention is useful for, inter alia, springs, valve seats and other valve parts, forging blocks and dies, extrusion plungers, chambers and dies, high temperature bolts and support members in lamps and vacuum tubes.

Although the present invention has been described in conjunction with desirable embodiments, it is to be understood that modifications may be resorted to without departing from the spirit and scope of the invention, as those skilled in the art will readily understand. Such modifications are considered to be within the purview and scope of the invention and appended claims.

We claim:

1. A cast article composed of an alloy comprising 5% to 9% chromium, 7.5% to 12% tungsten and 1% to 4% molybdenum with the total of tungsten-plus-molybdenum not greater than 14% and the total of chromium-plus-tungsten-plus-molybdenum not greater than 20%, 7% to 16% cobalt, 3% to 6% tantalum, 2.5% to 5% aluminum and 2.5% to 5% titanium with the total of aluminum-plus-titanium being 6.5% to 8.5%, 0.01% to 0.2% carbon, 0.01% to about 0.2% zirconium, 0.01% to about 0.1% boron, up to about 3% hafnium, up to about 2% columbium, up to about 2% iron, up to about 1% vanadium, up to 0.02% yttrium and balance essentially nickel in an amount comprising at least 50% of the alloy and characterized, after a double heat treatment comprising heating at least one hour at 1975°F. to 2200°F., air cooling, thereafter heating at least 12 hours at 1500°F. to 1600°F., and air cooling, by a stress rupture life of at least 20 hours at 29,000 pounds per square inch and 1850°F.

2. An alloy as set forth in claim 1 containing 6% to 8% chromium.

3. An alloy as set forth in claim 1 containing 2% to 4% molybdenum.

4. An alloy as set forth in claim 1 containing 8% to 10% tungsten.

5. An alloy as set forth in claim 1 containing 6% to 8% chromium, 2% to 4% molybdenum, and 8% to 10% tungsten.

6. An alloy as set forth in claim 1 wherein the total of tungsten-plus-molybdenum is 10% to 12% and the total of chromium-plus-tungsten-plus molybdenum is at least 16%.

7. An alloy as set forth in claim 1 wherein the total of aluminum-plus-titanium is at least 7.5%.

8. An alloy as set forth in claim 1 wherein the titanium content exceeds the aluminum content by a ratio of 1.2 to 1.8 titanium-to-aluminum.

9. An alloy as set forth in claim 1 wherein the aluminum content exceeds the titanium content by a ratio of 1.5 to 2 aluminum-to-titanium.

10. An alloy as set forth in claim 1 wherein the total of chromium-plus-tungsten-plus-molybdenum is 17% or greater and the tantalum content is not greater than 5%.

11. An alloy as set forth in claim 1 wherein the carbon content is not greater than 0.15%.

12. An alloy as set forth in claim 1 containing metal from the group consisting of up to 3% hafnium, up to 0.02% yttrium and mixtures thereof.

13. An alloy as set forth in claim 1 containing 7% to 8% chromium, 8% to 12% cobalt, 7.5% to 10.5% tungsten, 1.5% to 2.5% molybdenum, 3% to 4.5% tantalum, 2.5% to 3.5% aluminum, 4% to 5% titanium, 0.06% to 0.15% carbon, .05% to 0.15% zirconium, .01% to 0.08% boron and having a nickel content of at least 55%.

14. An alloy as set forth in claim 13 containing 9% to 10.5% tungsten.

15. An alloy as set forth in claim 13 containing 7.5% to 8.5% tungsten.

16. An article as set forth in claim 1 having a directionally solidified grain structure.

* * * * *